(12) United States Patent
King et al.

(10) Patent No.: US 6,950,543 B2
(45) Date of Patent: Sep. 27, 2005

(54) METHOD AND SYSTEM FOR IMAGE RECONSTRUCTION

(75) Inventors: Kevin Franklin King, New Berlin, WI (US); Elisabeth Angelos, Hartland, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 572 days.

(21) Appl. No.: 10/063,531

(22) Filed: May 2, 2002

(65) Prior Publication Data

US 2003/0206648 A1 Nov. 6, 2003

(51) Int. Cl.⁷ .............................................. G06K 9/00
(52) U.S. Cl. .................... 382/128; 382/269; 128/922; 345/611; 358/3.26
(58) Field of Search ................................. 382/100, 128, 382/131, 269, 275; 128/922; 250/455.11; 345/611; 358/3.26

(56) References Cited

U.S. PATENT DOCUMENTS

| | | | | |
|---|---|---|---|---|
| 5,016,173 | A | * 5/1991 | Kenet et al. ................ | 382/128 |
| 6,307,368 | B1 | 10/2001 | Vasanawala et al. ........ | 324/309 |
| 6,341,179 | B1 | 1/2002 | Stoyle et al. ............... | 382/254 |
| 2001/0027262 | A1 | 10/2001 | Mistretta et al. ............ | 600/9 |
| 2002/0011843 | A1 | 1/2002 | Harvey ....................... | 324/307 |
| 2002/0014889 | A1 | 2/2002 | Prussmann et al. ......... | 324/307 |
| 2003/0055330 | A1 | * 3/2003 | King et al. .................. | 600/410 |
| 2003/0109781 | A1 | * 6/2003 | Zhang ........................ | 600/410 |

FOREIGN PATENT DOCUMENTS

EP    1 102 076 A2    5/2001

OTHER PUBLICATIONS

Magnetic Resonance in Medicine (1999), "SENSE: Sensitivity Encoding for Fast MRI", Authors: Klass P. Pruessmann, Markus Weiger, Markus B. Scheidegger, and Peter Boesiger, pp. 952–962.

Magnetic Resonance in Medicine (2001), "Specific Coil Design for SENSE: A Six–Element Cardiac Array", Authors: Markus Wieger, Klass P. Pruessmann, Christoph Leussler, Peter Roschmann and Peter Boesiger, pp. 495–504.

Magnetic Resonance in Medicine (2001), "Planar Strip Array (PSA) for MRI", Authors: Ray F. Lee, Charles R. Westgate, Robert G. Weiss, David C. Newmann and Paul A. Bottomley, pp. 673–683.

W.H. Press, S.A. Teulolski, W.T. Vetterling, B.P. Flannery, Numerical Recipes in C, Cambridge University Press, 1992, pp. 804–808.

(Continued)

*Primary Examiner*—Samir Ahmed
*Assistant Examiner*—Anand Bhatnagar
(74) *Attorney, Agent, or Firm*—Cantor Colburn LLP (57) ABSTRACT

A method for reconstructing an image of an object includes unwrapping a reduced field of view image, and estimating edge boundaries using the unwrapped reduced field of view image. The estimated edge boundaries are used to calculate the number of aliasing replicates in the reduced field of view image. The number of aliasing replicates is used to unwrap the reduced field of view image.

25 Claims, 6 Drawing Sheets

OTHER PUBLICATIONS

"SENSE Coefficient Calculation using Adaptive Regularization", Authors: Peter Kellman and Elliot R. McVeigh, Laboratory of Cariac Energetics, National Heart, Lung and Blood Institutes of Health ,In Workshop on Minimum MR Data Acquisition Methods: Making More with Less, Oct. 20–21, 2001, Marco Island, Florida, pp. 121–124.

C.A. MacKenzie, M.D. Price, E.N. Yeh, M.O. Ohliger, D.K. Sodickson, "New Approach to Self–Calibrating Parrell Imaging", in Proc. Intl. Soc. Mag. Reson. Med. 9, p. 7 (2001).

Pruessmann K. P. et al., "Sense: Sensitivity Encoding for Fast MRI",Magnetic Resonance In Medicine, 1999, vol. 42, No. 5: 952–962.

Heidemann R. M. et al., "VD–Auto–Smash Imaging", Magnetic Resonance in Medicine, 2001, vol. 45, No. 6:1066–1074.

\* cited by examiner

Normal image

FIG. 9

SENSE image before unwrapping

FIG. 10

Combination image

METHOD AND SYSTEM FOR IMAGE RECONSTRUCTION

BACKGROUND OF INVENTION

This invention relates to imaging methods and systems. More particularly, the invention relates to a method and system for image reconstruction.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One method of acquiring an NMR data set from which an image can be reconstructed is known as the "spin-warp" technique, which is a variant of the well known Fourier transform (FT) imaging technique. The spin-warp technique is discussed in an article entitled "Spin-Warp NMR Imaging and Applications to Human Whole-Body Imaging" by W. A. Edelstein et al., Physics in Medicine and Biology, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT image acquisition, a series of pulse sequences is performed in which the magnitude of the phase encoding gradient pulse $G_y$ in the pulse sequence is incremented ($\Delta G_y$). The resulting series of views that is acquired during the scan form an NMR image data set from which an image can be reconstructed. The acquisition of each phase encoded view requires a finite amount of time, and the more views that are required to obtain an image of the prescribed field of view (FOV) and spatial resolution, the longer the total scan time.

Many technical developments in the field of MR imaging aim to reduce data acquisition time. One such technical development is known as parallel imaging, in which multiple receive coils are used to reduce scan time.

In parallel imaging techniques, the reduction in scan time comes from omitting k-space lines or, equivalently, spacing the lines further apart. However, the reduction in k-space lines has the effect of reducing the FOV, thus producing image wrapping or aliasing if the object extends outside the reduced FOV in the phase encoding direction.

The aliasing associated with parallel imaging may be eliminated using one of two general techniques. In one technique, the missing k-space lines are synthesized using the receive coil sensitivity (B1 field) spatial information, followed by a Fourier transform to reconstruct an image without aliasing. This technique is called SiMultaneous Acquisition of Spatial Harmonics (SMASH), and is described by Sodickson, et al., "Simultaneous Acquisition Of Spatial harmonics (SMASH)", *Magnetic Resonance In Medicine* 1997,38:591–603. In a second technique, the aliased images reconstructed from each coil are combined using the receive coil sensitivities to cancel the aliasing. This technique is called sensitivity encoding (SENSE) and is described by K. P. Pruessmann, et al., "SENSE: Sensitivity Encoding for Fast MRI", *Magnetic Resonance in Medicine* 42, 952–962 (1999). Although these are the two most common parallel imaging methods, other generalized parallel imaging methods combine aspects of both techniques.

In the SENSE technique, the idea is to reduce acquisition time by increasing the step size ($\Delta G_y$) between phase encoding views, or equivalently, by reducing the FOV. In either case, the total number of views is reduced with a consequent reduction in scan time. If the object extends outside the reduced FOV, however, aliasing or wrap-around occurs in the phase encoding direction. The SENSE technique removes this aliasing by using knowledge of the surface coil receive field (also called sensitivities) to find the unaliased spin distribution. This knowledge is obtained by performing a sensitivity calibration scan prior to the reduced FOV (SENSE) scan. For example, the sensitivity calibration data may be obtained using combined signals from the surface coils as described in co-pending U.S. patent application Ser. No. 09/851,775 filed on May 9, 2001 and entitled "Calibration Method For Use With Sensitivity Encoding MRI Acquisition".

During both the SENSE scan and the calibration scan, the patient may be required to hold his or her breath to minimize respiratory motion artifacts. If the patient and/or coil move in the phase encoding direction between the calibration and SENSE scans, for example if the patient were to intake a different volume of air during each of the scans, artifacts due to uncorrected aliasing can result.

One method of reducing artifacts due to patient motion between the calibration and SENSE scans is to extend the sensitivity measurement outside the boundaries of the object boundaries detected in the calibration scan using, for example, linear extrapolation. In conjunction with extending the sensitivity, the object boundaries are also extended to be outside those measured in the calibration scan. If the sensitivity and edges are extended sufficiently far, the sensitivity will be estimated at all pixels within the object at its position during the SENSE scan, and in addition, the number of aliased replicates will be greater than or equal to the actual number of replicates at all pixels. For typical scan prescriptions and typical respiratory motion, it has been found that edge and sensitivity extension by 10 to 20 pixels is sufficient. This enables accurate aliasing unwrapping at all pixels, even if the object moved after the calibration scan. However, the final image noise will be higher at pixels where the number of aliased replicates is overestimated. The increased noise frequently covers a large enough area to be noticeable and objectionable.

If the number of aliased replicates is overestimated, an adaptive, pixel-dependent regularization of the SENSE reconstruction has been used to reduce image noise. Adaptive regularization is a well-known numerical method used to reduce noise in the solution of inverse problems.

However, one drawback to adaptive regularization is that it requires much iteration to determine the optimum regularization and therefore requires a long reconstruction time.

Another method of reducing artifacts due to patient motion between the calibration and SENSE scans is to combine both scans while the patient holds a single breath. Yet another method of reducing artifacts due to patient motion between the calibration and SENSE scans is to allow the patient to breathe freely while taking multiple averages during the calibration scan. These methods, however, increase the SENSE scan time, thus partially negating some of the advantages of the SENSE technique.

SUMMARY OF INVENTION

The above-described drawbacks and deficiencies are overcome or alleviated by a method for reconstructing image of an object, the method comprising: acquiring a calibration image of the object; finding an edge of the object in the calibration image; calculating a first number of aliasing replicates at a pixel location in the reduced field of view image using the edge found in the calibration image; unwrapping the reduced field of view image using the first number of aliasing replicates to create a first unwrapped image; finding the edge of the object in the first unwrapped image; calculating a second number of aliasing replicates at the pixel location in the reduced field of view image using the edge found in the first unwrapped image; and unwrapping the reduced field of view image using the second number of aliasing replicates to create a second unwrapped image.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures.

DETAILED DESCRIPTION

Figure 1:
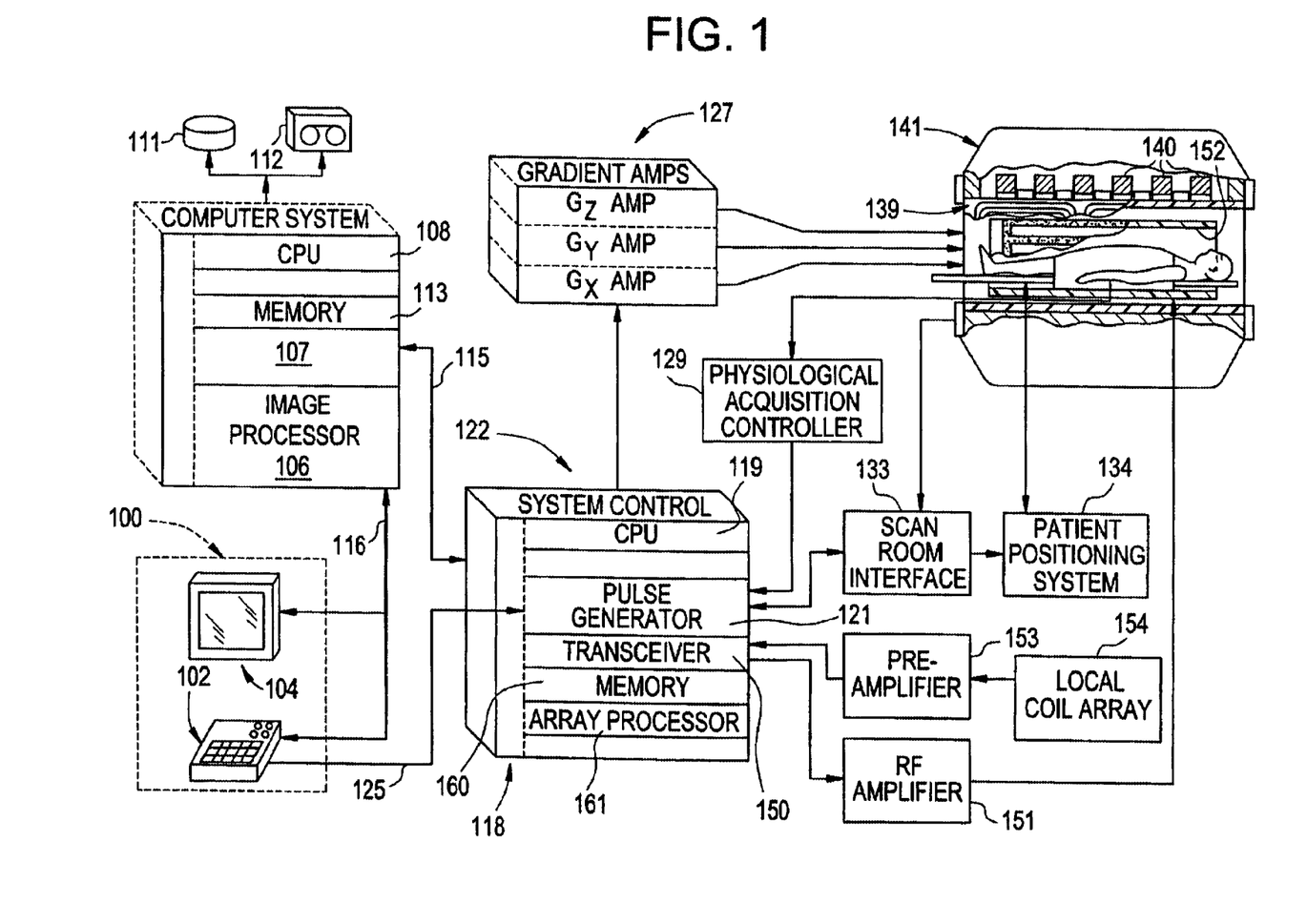
FIG. 1 is a block diagram of an MRI system which employs the present invention.

Referring first to FIG. 1, there is shown an embodiment of a MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules that communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152. The resulting signals radiated by the excited spins in the patient may be sensed by the same RF coil 152, but in the preferred embodiment a local coil array indicated at 154 is employed. The local coil array 154 is positioned around the patient anatomy to be imaged and it includes four separate coil elements (shown in FIG. 2) which receive the NMR signals that are produced during the scan. These NMR signals are separately amplified by pre-amplifiers 153 and applied to the inputs of four separate receivers in the transceiver module 150. The amplified NMR signals are demodulated, filtered, and digitized in the receiver sections of the transceiver 150 to produce four separate k-space data sets.

Figure 2:
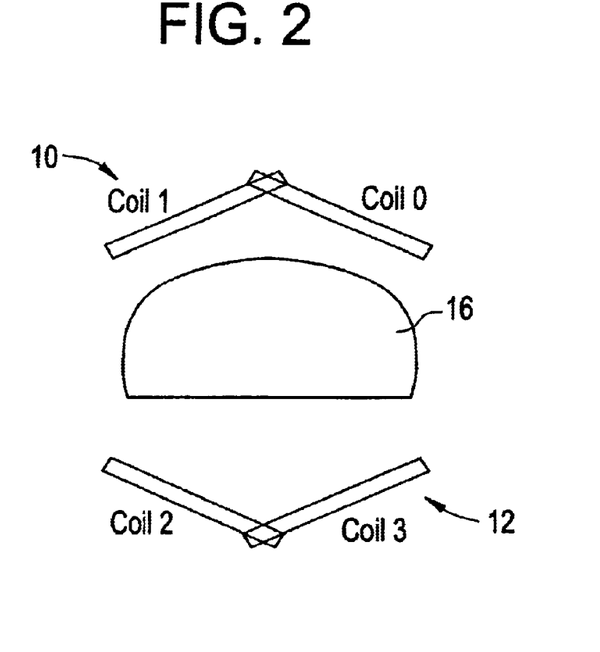
FIG. 2 is a schematic representation of a patient in the MRI system of FIG. 1 surrounded by an array of four local coils.

The local coil array 154 may be similar to that disclosed in U.S. Pat. No. 4,825,162. Referring to FIG. 2, each multi-coil set consists of two flexible paddles 10 and 12, each with two surface coil elements fabricated with etched copper on a flexible plastic substrate, for a total of four coil elements. Each coil element is a rectangular loop, approximately 12×25 cm and adjacent elements are overlapped to minimize mutual inductance. The elements are tuned using capacitors distributed around each element, and interface circuitry is added to permit detuning of the element during RF transmission. The coils are positioned anterior and posterior to the imaging volume as depicted in FIG. 2. It should be apparent to those skilled in the art that the present invention is not limited to any particular local coil array and that many alternative local coils are commercially available and suitable for this purpose.

The NMR signals picked up by the coil array 154 are digitized by the transceiver module 150 and transferred to a memory module 160 in the system control 122. When the image scan is completed the four resulting k-space data sets are processed as will be described in more detail below. This data is conveyed through the serial link 115 to the computer system 107 where it is stored in the disk memory 111. In response to commands received from the operator console 100, this data may be archived on the tape drive 112, or it may be further processed by the image processor 106 and conveyed to the operator console 100 and presented on the display 104.

The above-described MRI system may be used to perform many prescribed scans on a patient positioned in the bore of the magnet 141. Such prescriptions identify the type of imaging pulse sequence to be used (e.g., GRE, FSE, EPI, etc.) and the particular scan parameters for the selected pulse sequence (e.g. TR, TE, flip-angle). The present invention may be used with any such prescribed scan.

Figure 3:
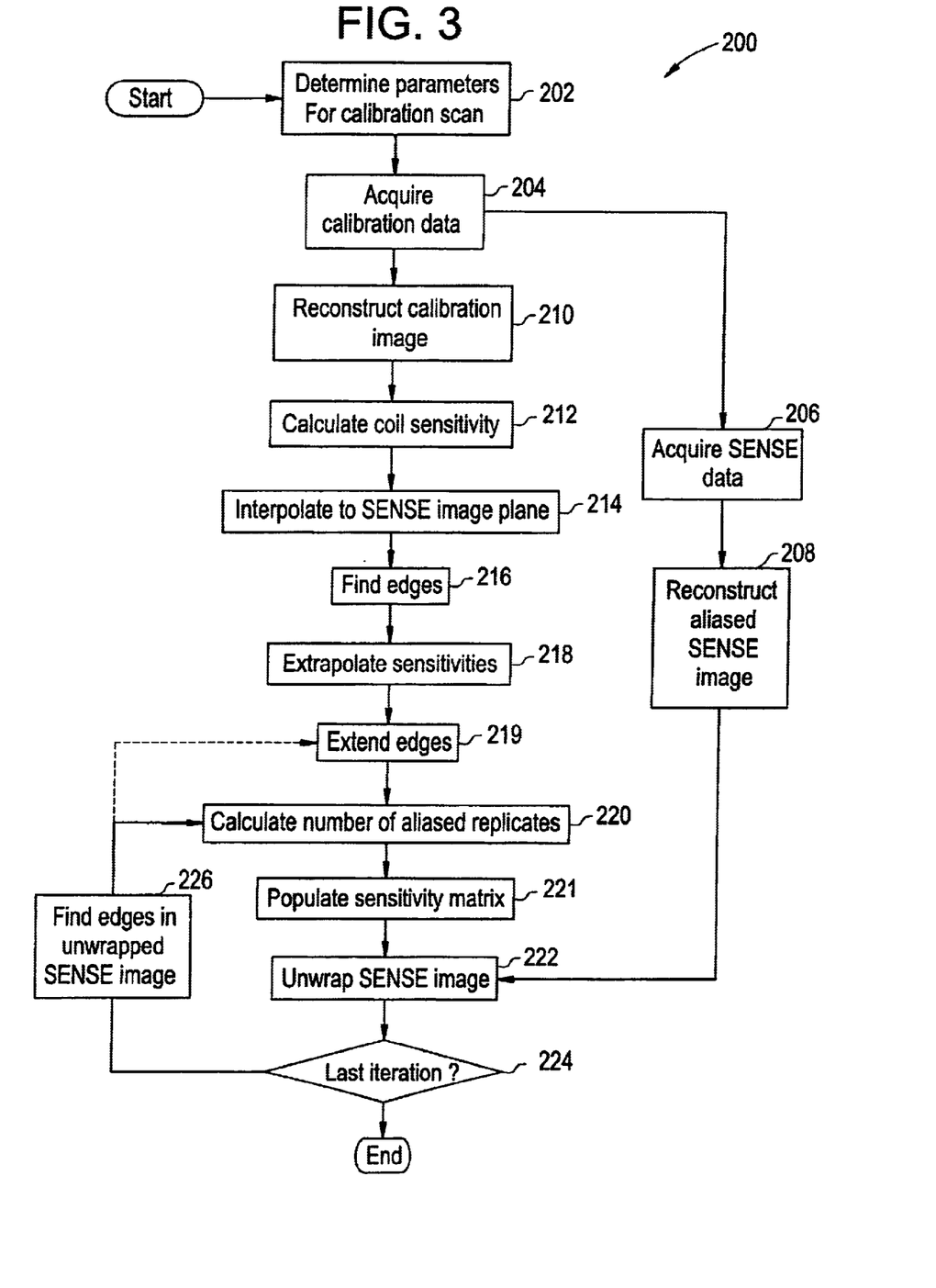
FIG. 3 is a flow chart illustrating a method of image reconstruction.
Figure 4:
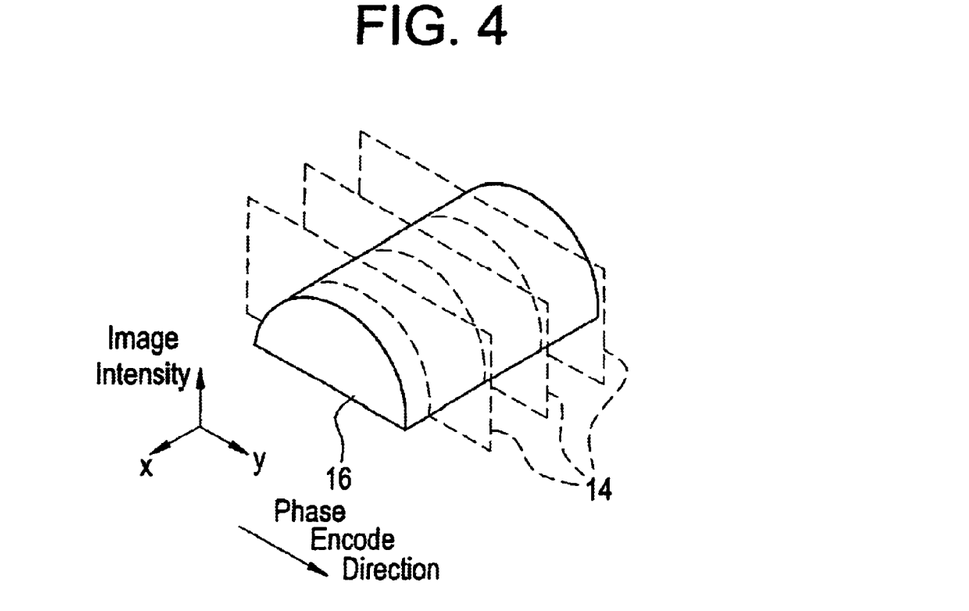
FIG. 4 is a pictorial representation of an object scanned with the MRI system of FIG. 1, illustrating phase encode columns of a calibration image.
Figure 5:
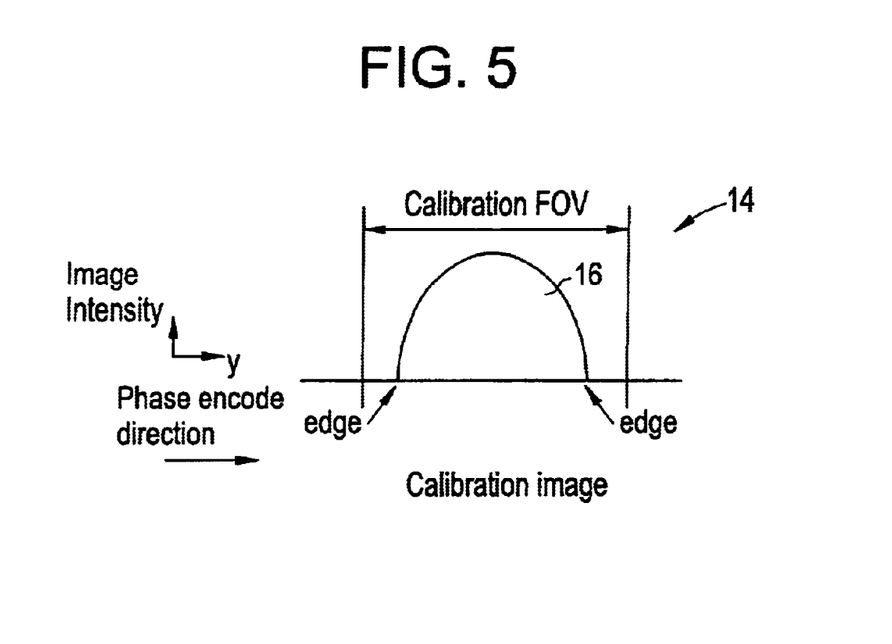
FIG. 5 is a pictorial representation of a of an object scanned with the MRI system of FIG. 1, illustrating a phase encode column of a calibration image.

Referring particularly to FIG. 3, a method of image reconstruction, which may be employed by the system of FIG. 1, is shown generally at 200. The scan parameters which define the imaging volume are input by the operator along with other scan parameters. The scan parameters are employed to determine the parameters of a calibration pre-scan as indicated at block 202. In FIG. 4, three such prescribed phase encode columns are shown at 14. As represented in FIG. 5, the FOV of these phase encode columns is larger than the object 16 being imaged. In the preferred embodiment the calibration pre-scan employs the surface coil elements 10 and 12 of FIG. 2 to acquire data from which their sensitivity is determined as disclosed in the above-cited co-pending U.S. patent application Ser. No. 09/851,775. Although many different imaging pulse sequences may be used to perform the calibration pre-scan, a fast, 2D gradient-recalled echo pulse sequence may be employed because of its speed and other well known qualities. A flip-angle of 45°, a TR of 100 msec and a TE of 6 msec is prescribed for the calibration pre-scan. The entire imaging volume is covered using contiguous slices from 5 to 10 mm in thickness and with 128×128 voxels in each slice. These parameters are lower in resolution than the typical imaging prescription, but the resolution is sufficient to produce a quality sensitivity matrix S while limiting the calibration pre-scan time.

In block 204, a calibration scan is performed to obtain calibration data for each coil. This is done with the patient positioned in the MRI system. After the last calibration slice has been acquired, the prescribed image (SENSE) scan is performed, as indicated in block 206. As indicated above, any imaging pulse sequence may be used, but RF excitation is performed using the RF body coil 152 and NMR signal acquisition is performed using the local coil array 154.

Figure 6:
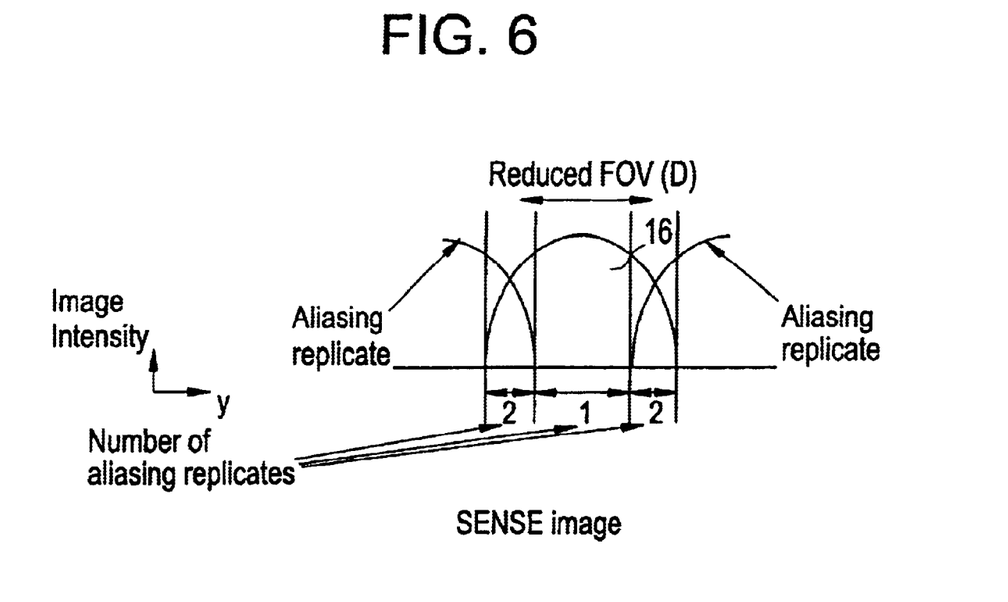
FIG. 6 is a pictorial representation of a of an object scanned with the MRI system of FIG. 1, illustrating a phase encode column of a SENSE image.

The SENSE technique allows for a faster scan by reducing the field of view (FOV) along one or more phase encoding axes by a reduction factor R. If the field of view is reduced in a phase encoding axis by a factor of R, the scan time is also correspondingly reduced by a factor of R. However, now the reconstructed image is aliased or replicated in the phase encoding direction at multiples of FOV/R=D and aliasing replicates now overlap with resulting loss of diagnostic utility. For example, FIG. 6 shows a single phase encode column of the SENSE image with a reduced FOV, indicated as D. The number of aliasing replicates for each pixel within various regions of the image is shown. For the SENSE image to be of diagnostic utility, the image must be unwrapped (un-aliased). In FIG. 6, and in the following discussion, the phase encoding gradient axis is indicated as the y-axis, however, it should be understood, that any phase encoding axis is possible and the invention is not limited to a specific gradient axis direction.

Referring again to FIG. 3, after the SENSE data has been acquired, the next step in method 200 is to reconstruct each aliased SENSE image $I_j(y)$ produced by each local coil j=0, 1, 2, ... N−1, as indicated in block 208. This may include performing a 2D Fourier transformation on the aliased SENSE image data and organizing the complex intensity values for each location x into an array I where y is the phase encode location at the given x:

$$I = \begin{bmatrix} I_0(y) \\ I_1(y) \\ \vdots \\ I_{N-1}(y) \end{bmatrix} \quad (1)$$

The calibration data that acquired in block 204 is used to reconstruct a set of calibration images $I_j^{cal}(y)$ for each surface coil j=0, 2, ... N−1 in the phase encoding gradient axis y, as indicated at block 210. This reconstruction may be a two-dimensional, complex Fourier transformation which yields a 128×128 array of complex pixel intensity values for each slice acquired by each local coil.

The sensitivity $S_j(y)$ for each local coil j is then calculated at block 212. While coil sensitivity may be calculated using any known technique, two exemplary embodiments are as follows. In one embodiment the local coil sensitivity $S_j(y)$ is calculated as follows:

$$S_j(y) = \frac{I_j^{cal}(y)}{\sqrt{\sum_{j=0}^{N-1} |I_j^{cal}(y)|^2}}. \quad (2)$$

where N is the number of local coils and $I_j^{cal}(y)$ is a complex image acquired over the full FOV of the imaging volume with surface coil j.

In a second embodiment, the sensitivity $S_j(y)$ is defined as:

$$S_j(y) = \frac{I_j^{cal}(y)}{\sum_{j=0}^{N-1} I_j^{cal}(y)}. \quad (3)$$

The sensitivity definition in equation 3 has the advantage that the complex magnetization completely drops out of the definition, thereby resulting in more accurate phase information in the reconstructed image.

Both of these methods for calculating the local coil sensitivity $S_j(y)$ in essence calculate the ratio of the calibration image intensity of the local coil itself and the sum of all the local coil calibration image intensities.

The calibration images $I_j^{cal}(y)$ are not necessarily aligned with their corresponding SENSE image plane because the different images may be acquired with different slice orientations and different image resolution. The next step, therefore, is to align the calibration object images $I_j^{cal}(y)$ with their corresponding SENSE image planes, as indicated at block 214. This can be accomplished by linear interpolation of calibration object image pixels.

The object edges, which are indicated in FIG. 5, are then located in the calibration image, as indicated at block 216 of FIG. 3. This may be performed by searching inward from the edges of the calibration image along the phase encoding direction until a pixel having an intensity above the established threshold is located. All pixels encountered before this location are set to zero, and if the center of the image is reached, the search is stopped along that path. As a result, a calibration image is produced in which all pixels outside the object 16 are set to zero.

In block 218, to help compensate for possible movement of object 16 between the calibration and SENSE scans, the sensitivity measurement may be extended outside the object boundaries using, for example, linear extrapolation. In block 217, the object boundaries may also be extended outside those measured. If the sensitivity edges are extended sufficiently far, the sensitivity will be estimated at all pixels within the object at its position during the SENSE scan. In addition, calculation of the number of aliased replicates will be greater than or equal to the actual number of replicates at all pixels. For typical scan prescriptions and typical respiratory motion, it has been found that edge and sensitivity extension by 10 to 20 pixels is sufficient to enable accurate aliasing unwrapping at all pixels, even if the object moved between the calibration and SENSE scans.

The next step indicated at block 220 is to calculate the number of aliased replicates, A, using the FOV reduction factor R and the edge locations. Once the object edges are determined for each phase encoding column, the number of overlapped aliasing replicates for each pixel in the column is determined as follows. Let the pixel locations of the upper and lower edges be $e_U$ and $e_L$ respectively. Translate the left edge to the right in increments of the alias distance D until the right edge of the unreduced field of view is crossed. For each pixel y, count the number of locations, including the original untranslated location, for which the pixel is above the edge. Let that number be $n_L$. Translate the right edge to the left in increments of the alias distance D until the left edge of the unreduced FOV is crossed. For each pixel y, count the number of locations, including the original untranslated location, for which the pixel is below the edge. Let that number be $n_U$. The number of aliased replicates A at pixel y is $n_L+n_U-1$.

Method 200 then continues to block 221, where the sensitivity matrix S, is populated with separate coil sensitivities $S_j(y)$, the number of aliased replicates A, and the reduced FOV D:

$$S = \begin{bmatrix} S_0(y) & S_0(y+D) & \ldots & S_0(y+(A-1)D) \\ S_1(y) & S_1(y+D) & \ldots & S_1(y+(A-1)D) \\ \vdots & & & \\ S_{N-1}(y) & S_{N-1}(y+D) & \ldots & S_{N-1}(y+(A-1)D) \end{bmatrix} \quad (4)$$

In block 222, the SENSE images $I_j(y)$ are then unwrapped to create an unwrapped SENSE image (proton distribution image) M. This may include applying the equation:

$$M=[(S^*S)^{-1}S^*]I \quad (5)$$

where S is the sensitivity matrix from block 220, I is the aliased SENSE image array of block 208, and S* is the complex conjugate transpose of the sensitivity matrix S.

At process block 224 it is determined whether the current iteration is the last iteration to be performed. More than two iterations may be performed; however, it is anticipated that only two iterations are required for optimal image quality. The number of iterations may be predetermined. Alternatively, the number of iterations may be determined by comparing the image from the current iteration with the image from the previous iteration. When a suitable measurement of the difference is sufficiently small (such a measurement could be the sum of squares of the differences for all pixels in the two images), the iteration may be stopped. If the present iteration is the last iteration, method 200 ends, and the proton distribution image M is applied in a manner known in the art.

If, at block 224, the present iteration is not the last iteration, then method 200 continues to block 226, where the object boundary (edge) is located in the proton distribution image M from block 222. This may be performed by searching inward from the edges of the image along the phase encoding direction until a pixel having an intensity above the established threshold is located.

In one embodiment, after the edges have been located, method 200 then returns to block 220, where the number of aliased replicates, A, is calculated using the FOV reduction factor R and the new edge locations determined in block 226. The method used for determining A may be the same as that described for use in block 220.

In an alternative embodiment, which is indicated in phantom on FIG. 3, method proceeds from block 226 to block 219, where the edge locations determined in block 226 are extended prior to calculating the number of aliased replicates, A. Extending the edge location helps to ensure that any errors in edge detection do not result in underestimation of A. For example, the edge locations may be extended by one or two pixels, which would increase image noise only in a small area of the image.

In either embodiment, after A has been calculated, method 200 proceeds to block 221 where A is input into the sensitivity matrix S, along with the separate coil sensitivities $S_j(y)$ determined in block 212, the reduced phase encoding FOV, D. In block 222, the sensitivity matrix S from block 221 is applied to unwrap the SENSE images $I_j(y)$ from block 208 using, for example, equation (5). Method 200 continues until the last iteration is performed.

Figure 7:
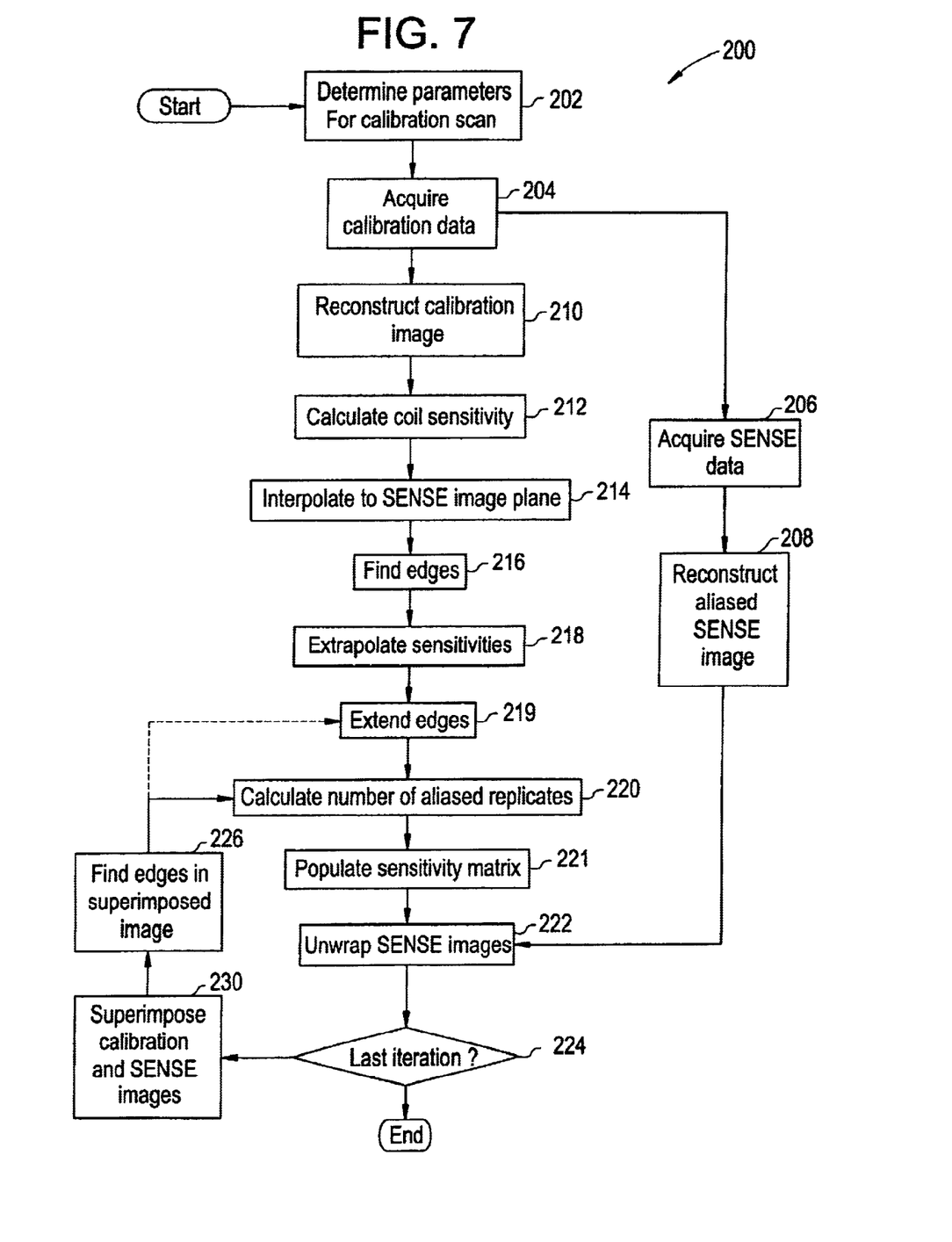
FIG. 7 is a flow chart illustrating an alternative embodiment of the method of image reconstruction.
Figure 8:
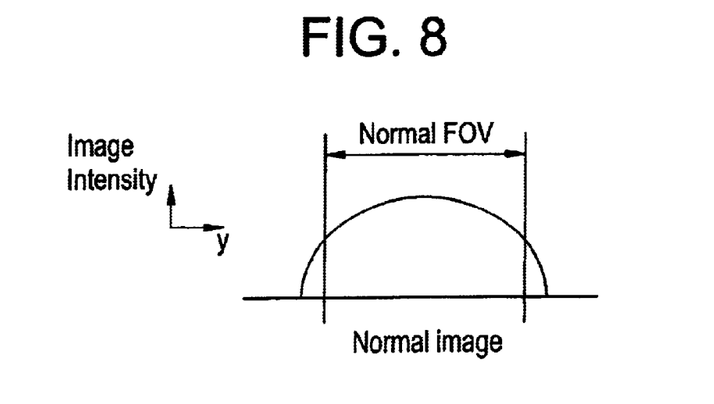
FIG. 8 is a pictorial representation of an object that is bigger than the normal FOV.
Figure 9:
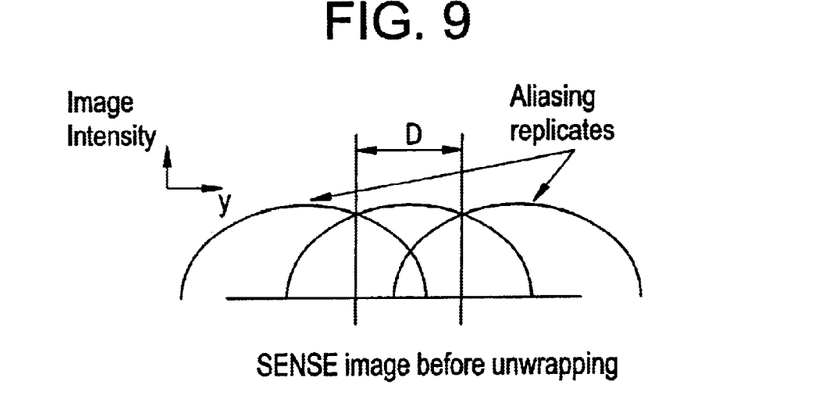
FIG. 9 is a pictorial representation of the object of FIG. 8 scanned with the MRI system of FIG. 1, illustrating a phase encode column of a SENSE image.

Referring to FIG. 7, an alternative embodiment of method 200 is shown. The embodiment of FIG. 7 is substantially similar to the embodiment of FIG. 3, with a block 230 added between previously-described blocks 224 and 226. In the embodiment of FIG. 7, method 200 is adapted for scan prescriptions where the object is not completely contained within the FOV after the image is unwrapped. This would occur, for example, in scan prescriptions where the FOV of the normal (non-calibration) image is smaller than the object being scanned, as shown in phase encode column of FIG. 8. The resulting SENSE image would have a reduced FOV, as indicated as D in the phase encode column of FIG. 9, and would yield overlapping aliasing replicates. Unwrapping of the aliased SENSE image would yield an image in which the object edges are not included, and, therefore, the unwrapped image would not be of value in the edge detection block 226.

Figure 10:
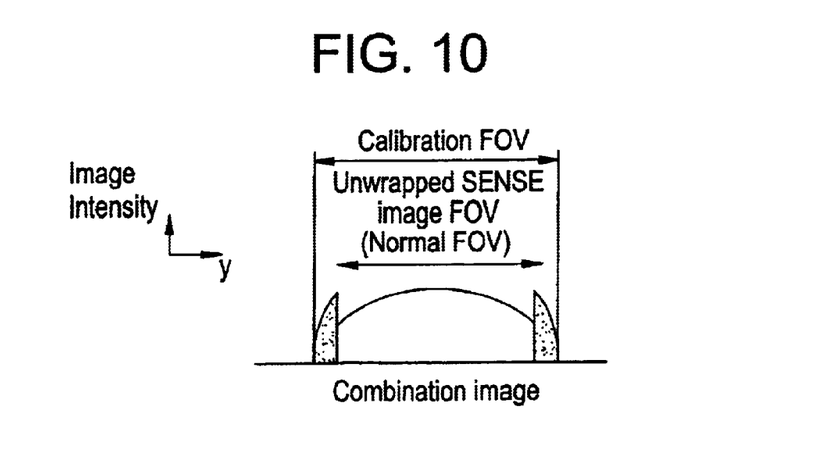
FIG. 10 is a pictorial representation of a combination of a calibration image and a SENSE image.

In block 230, the first reconstructed SENSE image is superimposed on the calibration image from block 210 that is used to reconstruct the first SENSE image. As shown in the phase encode column depicted in FIG. 10, the calibration scan uses a large FOV that will normally contain the entire object and, by combining the SENSE and calibration images, the edges can be determined. The SENSE and calibration images may have different scan parameters, leading to small intensity discontinuities, which are exaggerated in FIG. 10. This combination of the SENSE and calibration images from block 230 is then used in block 226 to find the edges. Method 200 Continues as described with reference to FIG. 3.

The iterative reconstruction method 200 described herein reduces artifacts due to uncorrected aliasing that can result from patient motion between the calibration and SENSE scans. In method 200 edge boundaries are estimated using an unwrapped SENSE image. As a result, the edge boundaries are correctly estimated even where the object moves between the calibration and SENSE images. Because the edge locations are accurate, calculation of the number of aliased replicates at each pixel is also accurate, resulting in full unwrapping of all aliasing together with the lowest possible noise at each pixel. Method 200 accomplishes this without the long scan time or reconstruction time associated with known methods.

The present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for reconstructing a reduced field of view image of an object, the method comprising:
    a) acquiring a calibration image of the object;
    b) finding an edge of the object in the calibration image;
    c) calculating a first number of aliasing replicates at a pixel location in the reduced field of view image using the edge found in the calibration image;
    d) unwrapping the reduced field of view image using the first number of aliasing replicates to create an unwrapped image;
    e) finding the edge of the object in the unwrapped image;
    f) calculating a second number of aliasing replicates at the pixel location in the reduced field of view image using the edge found in the unwrapped image; and
    g) unwrapping the reduced field of view image using the second number of aliasing replicates to create a new unwrapped image.

2. The method of claim 1, further comprising:
    repeating e) through g) a predetermined number of times.

3. The method of claim 1, further comprising:
    comparing the unwrapped image with the new unwrapped image to determine a difference; and
    repeating e) through g) until the difference is below a predetermined level.

4. The method of claim 1, wherein calculating the first number of aliasing replicates at a pixel location in the reduced field of view image using the edge found in the calibration image includes:
    extending the edge found in the calibration image.

5. The method of claim 1, wherein calculating the second number of aliasing replicates at the pixel location in the reduced field of view image using the edge found in the unwrapped image includes:
    extending the edge found in the first unwrapped image.

6. The method of claim 1, wherein finding the edge of the object in the unwrapped image includes:
    superimposing the unwrapped image and the calibration image.

7. A method for reconstructing an image of an object, the method comprising:
    a) acquiring a calibration image of the object;
    b) acquiring a reduced field of view image of the object, the reduced field of view image having a field of view dimension D along a phase encoding axis;
    c) calculating coil sensitivities using the calibration image;
    d) finding an edge of the object in the calibration image;
    e) calculating a first number of aliasing replicates at a pixel location in the reduced field of view image using the edge found in the calibration image;
    f) populating a first sensitivity matrix with the first number of aliasing replicates and the coil sensitivities;
    g) unwrapping the reduced field of view image using the first sensitivity matrix to create an unwrapped image;
    h) finding the edge of the object in the unwrapped image;
    i) calculating a second number of aliasing replicates at the pixel location in the reduced field of view image using the edge found in the unwrapped image;
    j) populating a second sensitivity matrix with the second number of aliasing replicates and the coil sensitivities; and
    k) unwrapping the reduced field of view image using the second sensitivity matrix to create a new unwrapped image.

8. The method of claim 7, further comprising:
    repeating h) through k) a predetermined number of times.

9. The method of claim 7, further comprising:
    comparing the unwrapped image with the new unwrapped image to determine a difference; and
    repeating h) through k) until the difference is below a predetermined level.

10. The method of claim 7, wherein calculating the first number of aliasing replicates at a pixel location in the reduced field of view image using the edge found in the calibration image includes:

extending the edge found in the calibration image.

11. The method of claim 7, wherein calculating the second number of aliasing replicates at the pixel location in the reduced field of view image using the edge found in the unwrapped image includes:

extending the edge found in the unwrapped image.

12. The method of claim 7 wherein finding the edge of the object in the unwrapped image includes:

superimposing the unwrapped image and the calibration image.

13. A storage medium encoded with machine-readable computer program code for reconstructing a reduced field of view image of an object, the storage medium including instructions for causing a computer to implement a method comprising:

a) finding an edge of the object using a calibration image of the object;

b) calculating a first number of aliasing replicates at a pixel location in the reduced field of view image using the edge found in the calibration image;

c) unwrapping the reduced field of view image using the first number of aliasing replicates to create an unwrapped image;

d) finding the edge of the object in the unwrapped image;

e) calculating a second number of aliasing replicates at the pixel location in the reduced field of view image using the edge found in the unwrapped image; and f) unwrapping the reduced field of view image using the second number of aliasing replicates to create a new unwrapped image.

14. The storage medium of claim 13, wherein said method further comprises:

repeating d) through f) a predetermined number of times.

15. The storage medium of claim 13, further comprising:

comparing the unwrapped image with the new unwrapped image to determine a difference; and repeating d) through f) until the difference is below a predetermined level.

16. The storage medium of claim 13, wherein calculating the first number of aliasing replicates at a pixel location in the reduced field of view image using the edge found in the calibration image includes:

extending the edge found in the calibration image.

17. The storage medium, of claim 13, wherein calculating the second number of aliasing replicates at the pixel location in the reduced field of view image using the edge found in the unwrapped image includes:

extending the edge found in the unwrapped image.

18. The storage medium of claim 13, wherein finding the edge of the object in the unwrapped image includes:

superimposing the unwrapped image and the calibration image.

19. An apparatus for reconstructing an image of an object, the apparatus comprising:

means for acquiring a calibration image and a reduced field of view image of the object; and a computer configured to:

a) find an edge of the object in the calibration image, b) calculate a first number of aliasing replicates at a pixel location in the reduced field of view image using the edge found in the calibration image, c) unwrap the reduced field of view image using the first number of aliasing replicates to create an unwrapped image, d) find the edge of the object in the unwrapped image, e) calculate a second number of aliasing replicates at the pixel location in the reduced field of view image using the edge found in the unwrapped image, and f) unwrap the reduced field of view image using the second number of aliasing replicates to create a new unwrapped image.

20. The apparatus of claim 19, wherein said computer is further configured to extend the edge found in the calibration image.

21. The apparatus of claim 19, wherein said computer is further configured to extend the edge found in the unwrapped image.

22. The apparatus of claim 19, wherein said computer is further configured to superimpose the unwrapped image and the calibration image.

23. The apparatus of claim 19, wherein said means for acquiring a calibration image and a reduced field of view image of the object includes:

a coil array disposed proximate the object;

a receiver module operably coupled to said coil array; and a memory module operably coupled to said receiver module, said memory module being operably coupled to said computer.

24. The apparatus of claim 19 wherein said computer is further configured to:

repeat d) through f) a predetermined number of times.

25. The apparatus of claim 19, wherein said computer is further configured to:

compare the unwrapped image with the new unwrapped image to determine a difference; and repeat d) through f) until the difference is below a predetermined level.

* * * * *